(12) United States Patent
Kumada et al.

(10) Patent No.: US 7,981,790 B2
(45) Date of Patent: Jul. 19, 2011

(54) SEMICONDUCTOR DEVICE AND METHOD OF FABRICATING THE SAME

(75) Inventors: Teruhiko Kumada, Chiyoda-ku (JP); Hideharu Nobutoki, Chiyoda-ku (JP); Naoki Yasuda, Chiyoda-ku (JP); Kinya Goto, Chiyoda-ku (JP); Masazumi Matsuura, Chiyoda-ku (JP)

(73) Assignee: Renesas Electronics Corporation, Kawasaki-shi (JP)

( * ) Notice: Subject to any disclaimer, the term of this patent is extended or adjusted under 35 U.S.C. 154(b) by 2 days.

(21) Appl. No.: 12/683,949

(22) Filed: Jan. 7, 2010

(65) Prior Publication Data
US 2010/0112805 A1    May 6, 2010

Related U.S. Application Data

(63) Continuation of application No. 11/452,376, filed on Jun. 14, 2006, now Pat. No. 7,671,473.

(30) Foreign Application Priority Data

Jun. 15, 2005  (JP) ................................ 2005-174975

(51) Int. Cl.
*H01L 21/4763* (2006.01)
(52) U.S. Cl. ........ 438/624; 438/623; 438/629; 438/638; 438/687; 257/E21.58
(58) Field of Classification Search ................ 438/118, 438/623, 624, 629, 638, 687; 257/E21.58
See application file for complete search history.

(56) References Cited

U.S. PATENT DOCUMENTS

| 7,427,443 | B2 | 9/2008 | Uchimaru et al. |
| 2003/0001278 | A1 | 1/2003 | Kojima et al. |
| 2003/0201465 | A1 | 10/2003 | Ryuzaki et al. |
| 2004/0135255 | A1 | 7/2004 | Matsunaga et al. |
| 2007/0281465 | A1 | 12/2007 | Otsuka |

FOREIGN PATENT DOCUMENTS

| JP | 2000-58538 | 2/2000 |
| JP | 2003-17561 | 1/2003 |
| JP | 2003-124307 | 4/2003 |
| JP | 2003-309173 | 10/2003 |
| JP | 2004-186649 | 7/2004 |

OTHER PUBLICATIONS

Satoshi Sugahara, et al., "A Proposed Organic-Silica Film for Inter-Metal-Dielectric Application", Jpn J. Appl. Phys., vol. 38, Mar. 1999, pp. 1428-1432, Part 1, No. 3A.

*Primary Examiner* — Samuel A Gebremariam
(74) *Attorney, Agent, or Firm* — Oblon, Spivak, McClelland, Maier & Neustadt, L.L.P.

(57) ABSTRACT

There is provided a semiconductor device and method of fabricating the same that employs an insulation film of a borazine-based compound to provided enhanced contact between a material for insulation and that for interconnection, increased mechanical strength, and other improved characteristics. The semiconductor device includes a first insulation layer having a recess with a first conductor layer buried therein, an etching stopper layer formed on the first insulation layer, a second insulation layer formed on the etching stopper layer, a third insulation layer formed on the second insulation layer, and a second conductor layer buried in a recess of the second and third insulation layers. The second and third insulation layers are grown by chemical vapor deposition with a carbon-containing borazine compound used as a source material and the third insulation layer is smaller in carbon content than the second insulation layer.

6 Claims, 3 Drawing Sheets

SEMICONDUCTOR DEVICE AND METHOD OF FABRICATING THE SAME

BACKGROUND OF THE INVENTION

1. Field of the Invention

The present invention relates generally to semiconductor devices and methods of fabricating the same and particularly to semiconductor devices that employ a borazine-based compound for an interlayer insulation film to achieve enhanced contact between the insulation film and an adjacent layer, such as an interconnection layer, a conductor diffusion preventing layer and the like that are adjacent to the insulation film, and methods of fabricating the same.

2. Description of the Background Art

In recent years, as semiconductor integrated circuits are increasingly highly integrated, the circuits have interconnections spaced narrower and increasing in parasitic capacitance therebetween. Semiconductor integrated circuits that require foremost fast operation are required to avoid signal delay and accordingly it is necessary to reduce such parasitic capacitance between interconnections. Furthermore, in order to avoid signal delay, it is also necessary to simultaneously reduce a material for interconnection in resistance. For semiconductor integrated circuits, aluminum and the like have been employed. Recently, copper is increasingly used as it has a small value in resistance. Furthermore, parasitic capacitance between interconnections is reduced by a method reducing an insulation film between interconnections in relative dielectric constant.

However, for example, a carbon containing silicon oxide film that is employed in the 90 nm generation is a film having a relative dielectric constant of around 2.8, and a hardness of 1.8 GPa and a Young's modulus of 14 GPa, which are significantly smaller than a hardness of 10 GPa and a Young's modulus of 80 GPa of a conventionally employed silicon oxide film and it has been pointed out that it has disadvantageous, smaller mechanical strength. As such, in a chemical mechanical polishing (CMP) step in forming a metal interconnection, a wire bonding step in assembly, and the like, there are concerns that the film may peel off, cracks and the like.

Furthermore, a film having a relative dielectric constant of around 2.2 that is expected to be applied in the 65 nm and 45 nm generations is expected to have further smaller values in hardness and Young's modulus of 0.6 GPa and 6 GPa, respectively.

Furthermore, while copper is increasingly used for a material for interconnection to avoid signal delay, as described above, there is a concern, as semiconductor devices are increasingly micro-fabricated, that the electric charge stored in an interconnection increases in density, and a local current and thermal stress concentration cause electromigration and stress migration serving as a cause of impaired reliability of the interconnection. Accordingly it is necessary to provide enhanced contact between an a material for insulation and that for interconnection.

Japanese Patent Laying-Open No. 2004-186649 discloses a method of forming an interlayer insulation film including a B—C—N bond to allow a film to be deposited with a small dielectric constant and high mechanical strength, and high bonding strength. The film is deposited by chemical vapor deposition using as a source material a compound having a borazine skeleton shown in the following chemical formula (1):

alone or in combination. In the chemical formula, $X_1$, $X_2$ and $X_3$ may be identical or different and are each a hydrogen atom, the amino group or the alkyl, alkenyl, alkynyl, monoalkylamino or dialkylamino group having a carbon number of 1-4 and $Y_1$, $Y_2$ and $Y_3$ may be identical or different and are each a hydrogen atom, the alkyl, alkenyl or alkynyl group having a carbon number of 1-4 or the trialkylsilyl group having a carbon number of 3-12, and $X_1$, $X_2$ and $X_3$ and $Y_1$, $Y_2$ and $Y_3$ are not all hydrogen atoms. A hardness and a Young's modulus having as high values as 2.0 GPa and 40 GPa, respectively can be achieved.

SUMMARY OF THE INVENTION

The present invention has been made to overcome the above described conventional technological disadvantage and it contemplates a semiconductor device that employs a borazine-based compound to provide enhanced contact between a material for insulation and that for interconnection, increased mechanical strength and the like characteristics, and a method of fabricating such semiconductor device.

In one aspect of the present invention there is provided a semiconductor device including a first insulation layer having a recess with a first conductor layer buried therein, an etching stopper layer formed on the first insulation layer, a second insulation layer formed on the etching stopper layer, a third insulation layer formed adjacent to the second insulation layer, and a second conductor layer buried in a recess of the second insulation layer and/or the third insulation layer. The second and third insulation layers are grown by chemical vapor deposition with a carbon-containing borazine compound used as a source material and the third insulation layer is smaller in carbon content than the second insulation layer.

In another aspect of the present invention there is provided a semiconductor device including a first insulation layer having a recess with a first conductor layer buried therein, an etching stopper layer formed on the first insulation layer, a second insulation layer formed on the etching stopper layer, a third insulation layer formed on the second insulation layer, and a second conductor layer buried in a recess of the second and third insulation layers. The second and third insulation layers are grown by chemical vapor deposition with a carbon-containing borazine compound used as a source material and the third insulation layer is smaller in carbon content than the second insulation layer.

In still another aspect of the present invention there is provided a semiconductor device including a first insulation layer having a recess with a first conductor layer buried therein, an etching stopper layer formed on the first insulation layer, a second insulation layer formed on the etching stopper layer, a second conductor layer buried in a recess of the second insulation layer, and a third insulation layer formed between the second conductor layer and the second insulation layer. The second and third insulation layers are grown by chemical vapor deposition with a carbon-containing borazine compound used as a source material and the third insulation layer is smaller in carbon content than the second insulation layer.

In still another aspect of the present invention there is provided a semiconductor device including a first insulation layer having a recess with a first conductor layer buried therein, an etching stopper layer formed on the first insulation layer, a second insulation layer formed on the etching stopper layer, a third insulation layer formed between the second insulation layer and the etching stopper layer, and a second conductor layer buried in a recess of the second and third insulation layers. The second and third insulation layers are grown by chemical vapor deposition with a carbon-containing borazine compound used as a source material and the third insulation layer is smaller in carbon content than the second insulation layer.

In still another aspect of the present invention there is provided a semiconductor device including a first insulation layer having a recess with a first conductor layer buried therein, an etching stopper layer formed on the first insulation layer, a second insulation layer formed on the etching stopper layer, a second conductor layer buried in a recess of the second and a third insulation layers, and the third insulation layer formed on the second insulation layer and between the second insulation layer and the etching stopper and second conductor layers. The second and third insulation layers are grown by chemical vapor deposition with a carbon-containing borazine compound used as a source material and the third insulation layer is smaller in carbon content than the second insulation layer.

In still another aspect of the present invention there is provided a semiconductor device including a first insulation layer having a recess with a first conductor layer buried therein, an etching stopper layer formed on the first insulation layer, a second insulation layer formed on the etching stopper layer, a third insulation layer formed on the second insulation layer and between the second insulation layer and the etching stopper layer, and a second conductor layer buried in a recess of the second and third insulation layers. The second and third insulation layers are grown by chemical vapor deposition with a carbon-containing borazine compound used as a source material and the third insulation layer is smaller in carbon content than the second insulation layer.

Preferably the second conductor layer is surrounded by a conductor diffusion preventing layer.

In still another aspect of the present invention there is provided a method of fabricating the semiconductor device as described above, wherein in the step of growing second and third insulation layers by chemical vapor deposition with a carbon-containing borazine compound used as a source material, the source material has varied carbon content to control the third and second insulation layers in carbon content.

In still another aspect of the present invention there is provided a method of fabricating the semiconductor device as described above, wherein in the step of growing second and third insulation layers by chemical vapor deposition with a carbon-containing borazine compound used as a source material, a carbon-containing gas is added to control the second insulation layer in carbon content.

In still another aspect of the present invention there is provided a method of fabricating the semiconductor device as described above, wherein in the step of growing second and third insulation layers by chemical vapor deposition with a carbon-containing borazine compound used as a source material, the second insulation layer has a surface processed by a plasmatized gas to adjust an insulation layer in carbon content to form the third insulation layer.

In the present semiconductor device and method of fabricating the same a carbon-containing borazine compound is used as a source material in chemical vapor deposition to grow an insulation film that has as small a dielectric constant as 2.5 or smaller and is hence effective in reducing parasitic capacitance between interconnections to avoid signal delay, as required for semiconductor integrated circuits required to operate rapidly.

Furthermore the insulation film has a Young's modulus of 20 GPa or larger and is superior in mechanical strength to an oxy-carbonized silicon-based insulation film that can provide an equivalent dielectric constant. This can prevent a layer from readily peeling off another layer, an insulation film from readily cracking, and other similar defects in a CMP process, a packaging process and other processes in which a multilayer interconnection structure experiences large stress.

Furthermore the insulation film that is reduced in carbon content can achieve enhanced contact with an etching stopper layer, a hard mask layer, a conductor layer and a conductor diffusion preventing layer that are adjacent thereto.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

In one aspect of the present invention there is provided a semiconductor device including a first insulation layer having a recess with a first conductor layer buried therein, an etching stopper layer formed on the first insulation layer, a second insulation layer formed on the etching stopper layer, a third insulation layer formed adjacent to the second insulation layer, and a second conductor layer buried in a recess of the second insulation layer and/or the third insulation layer. The second and third insulation layers are grown by chemical vapor deposition with a carbon-containing borazine compound used as a source material and the third insulation layer is smaller in carbon content than the second insulation layer.

First Embodiment

The present semiconductor device is a semiconductor device including a first insulation layer having a recess with a first conductor layer buried therein, an etching stopper layer formed on the first insulation layer, a second insulation layer formed on the etching stopper layer, a third insulation layer formed on the second insulation layer, and a second conductor layer buried in a recess of the second and third insulation layers. The second and third insulation layers are grown by chemical vapor deposition with a carbon-containing borazine compound used as a source material and the third insulation layer is smaller in carbon content than the second insulation layer.

The above described, present semiconductor device can have the second and third insulation layers grown by chemical vapor deposition using a carbon-containing borazine compound. The present semiconductor device can thus achieve reduced parasitic capacitance between interconnections, excellent mechanical strength, and enhanced contact.

In particular, the present semiconductor device is superior in that it can provide enhanced contact between the second and third insulation layers. As a ground for enhanced contact, Jpn. J. Appl. Phys., volume 38, page 1428 (March, 1999) describes that increased carbon content in insulation material results in reduced surface energy. As an insulation film grown by chemical vapor deposition with a carbon-containing borazine material used as a source material contains carbon, by adjusting the insulation films in content, enhanced contact can be achieved.

Figures 1, 2:
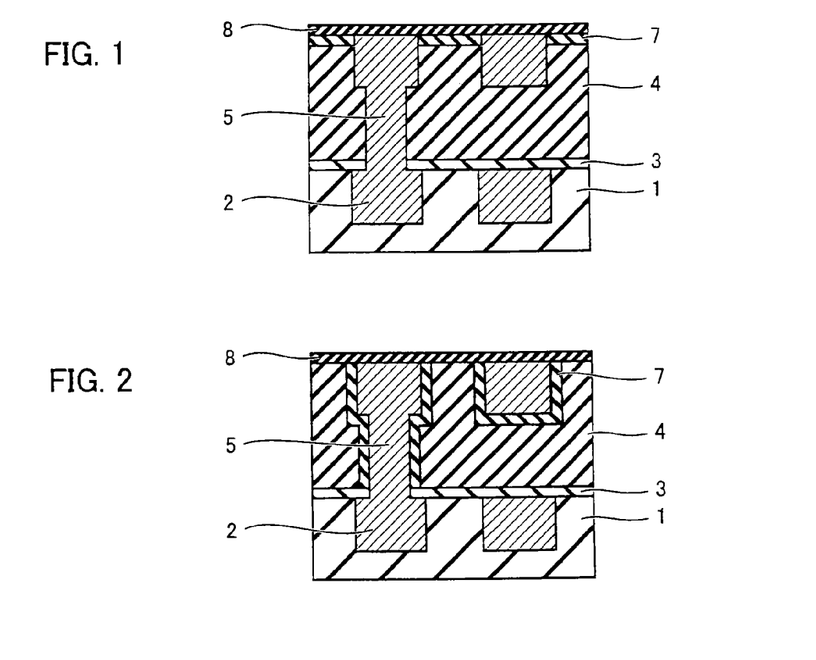
FIGS. 1-10 are cross sections schematically showing embodiments, respectively, of the present semiconductor device.

Hereinafter the present semiconductor device will be described with reference to FIG. 1. FIG. 1 is a schematic cross section of a semiconductor device in accordance with the present invention. In FIG. 1 the present semiconductor device includes a first insulation layer 1 having a recess with a first conductor layer 2 buried therein, an etching stopper layer 3 formed on the first insulation layer 1, a second insulation layer 4 formed on etching stopper layer 3, a third insulation layer 7 formed on the second insulation layer 4, a second conductor layer 5 buried in a recess of the second and third insulation layers 4 and 7, and, as required, a cap layer 8.

Herein the second and third insulation layers 4 and 7 are grown by chemical vapor deposition with a carbon-containing borazine compound used as a source material and the third insulation layer 7 is smaller in carbon content than the second insulation layer 4. Thus, enhanced contact can be achieved.

A method of fabricating the semiconductor device having the structure shown in FIG. 1 will be described hereinafter. Initially a method known in the field of the art is employed to bury the first conductor layer 2 in a recess of the first insulation layer 1. Then a method known in the field of the art is employed to form etching stopper layer 3 on the first insulation layer 1.

Subsequently a carbon-containing borazine compound is used as a source material and chemical vapor deposition (CVD) is employed to form the second insulation layer 4 on etching stopper layer 3. Then similarly a carbon-containing borazine compound is used and chemical vapor deposition (CVD) is employed to form the third insulation layer 7 on the second insulation layer 4. Herein the carbon-containing borazine compound used for the second insulation layer 4 is larger in carbon content than that used for the third insulation layer 7.

Then, photolithography and dry etching are employed to form a metal interconnection pattern in the second and third insulation layers 4 and 7 and CMP is employed to form the second conductor layer 5. Then cap layer 8 is formed on the third insulation layer 7. The semiconductor device shown in FIG. 1 can thus be fabricated.

In the present invention the semiconductor device has an insulation layer formed using a carbon-containing borazine compound having a structure shown in chemical formula (1):

(1)

wherein $X_1$, $X_2$ and $X_3$ may be identical or different and are each a hydrogen atom, the amino group or the alkyl, alkenyl, allynyl, monoalkylamino or dialkylamino group having a carbon number of 1-4 and $Y_1$, $Y_2$ and $Y_3$ may be identical or different and are each a hydrogen atom, the alkyl, alkenyl or alkynyl group having a carbon number of 1-4 or the trialkylsilyl group having a carbon number of 3-12, and $X_1$, $X_2$ and $X_3$ and $Y_1$, $Y_2$ and $Y_3$ are not all hydrogen atoms.

Herein the compound indicated by chemical formula (1) can be borazine ($B_3N_3H_6$) having at least one hydrogen atom substituted with a carbon-containing group. More specifically, it can be B,B,B-trimethylborazine, N,N,N-trimethylborazine, B,B,B-triethylborazine, N,N,N-triethylborazine, B,B,B-tripropylborazine, N,N,N-tripropylborazine, B,B,B-tributylborazine, N,N,N-tributylborazine, B,B,B,N,N,N-hexamethylborazine, B,B,B-triethyl-N,N,N-trimethylborazine, B,B,B-tripropyl-N,N,N-trimethylborazine, B,B,B-triethenylborazine, B,B,B-triethenyl-N,N,N-trimethylborazine, B,B,B-triethynylborazine, B,B,B-triethynyl-N,N,N-trimethylborazine, B,B,B-triaminoborazine, B,B,B-triamino-N,N,N-trimethylborazine, B,B,B-trismethylaminoborazine, B,B,B-trismethylamino-N,N,N-trimethylborazine, B,B,B-trisdimethylaminoborazine, and/or B,B,B-trisdimethylamino-N,N,N-trimethylborazine. They may be used singly or mixed together.

In the present invention when the above borazine compound is used to form the second and third insulation layers the borazine compound can be vaporized and transferred into a vacuumed chamber and thus deposited to form layers. To deposit the layer, heat, ultraviolet ray, electron beam, plasma field or the like can be applied to activate the borazine compound. In particular, if plasma field is applied to activate the borazine compound, helium, argon, nitrogen, oxygen, hydrogen, nitrogen monoxide, ammonia, carbon dioxide, methane, acetylene or a similar gas can be used together to deposit layers.

In the present invention, the third insulation layer smaller in carbon content than the second insulation layer can be formed by: using as a material therefor a borazine compound having a smaller number of carbon atoms than a borazine compound used to form the second insulation layer; employing a borazine compound with a carbon dioxide, methane, acetylene, or similar, carbon atom-containing gas simultaneously added thereto to form the second insulation layer, and employing the same borazine compound without the above described, carbon containing gas added thereto to form the third insulation layer; or employing oxygen, nitrogen, nitrogen monoxide, ammonia, or similar, plasma gas to perform a surface process after the second insulation layer is formed.

The second insulation layer is determined in composition with dielectric constant, mechanical strength and other characteristics considered. As obtained through x-ray photoelectron spectroscopy (XPS), it has a carbon content occupying 5-40% of the whole composition. In contrast, the third insulation layer, which is smaller in carbon content than the second insulation layer, desirably has a carbon content of 1-35%, more desirably 2-30%.

The present semiconductor device is not particularly limited in size. Desirably, however, the third insulation layer, which has a small carbon component, is at most 20% in thickness of the second insulation layer. For example, for interconnections spaced by 100 nm, an insulation layer including the second and third insulation layers desirably has a thickness of approximately 350 nm and the third insulation layer desirably has a thickness within a range of 5-50 nm. If the third insulation layer has a thickness equal to or smaller than 5 nm then at a portion there is a portion at which the third insulation layer is not formed, which provides a possibility that a layer may disadvantageously peel off another layer or the like. If the third insulation layer has a thickness of equal to or larger than 50 nm, the insulation layer including the second and third insulation layers would have an increased total dielectric constant.

Furthermore, the second and third insulation layers may have their respective carbon components gradually changed. To gradually change the carbon components, a CVD source material, i.e., carbon-containing borazine compounds, that has varied carbon content can be used such that it is supplied in a gradually changed amount.

The method of fabricating the semiconductor device having the structure shown in FIG. 1 will be described with reference to a specific example. The process up to forming the etching stopper layer is as has been described above. Initially, as one example of a carbon-containing borazine compound that is used to form the second insulation layer, B,B,B—N,N,N-hexamethylborazine is used as a source material and CVD is employed to form the second insulation layer.

Then, as one example of the borazine compound, N,N,N-trimethylborazine is used as a source material and CVD is employed to form the third insulation layer. In these insulation layers a metal interconnection pattern is formed by photolithography and dry etching. Subsequently, copper is deposited to form a conductor layer and thereafter CMP is employed to form the conductor layer buried in the second and third insulation layers. Then a SiC film is deposited as a cap layer. The interconnection structure shown in FIG. 1 is thus provided.

How the second insulation layer is formed by CVD with a carbon-containing borazine compound used as a source material will be more specifically described hereinafter. If plasma CVD is employed, helium gas is used as a carrier gas to introduce B,B,B—N,N,N-hexamethylborazine through a heated introduction pipe into a reaction chamber having a substrate placed therein. In the reaction chamber, an RF having a frequency of 13.56 MHz is applied and 200 W is used to plasmatize the gas causing reaction. The substrate is heated to have a temperature of 300° C. and B,B,B—N,N,N-hexamethylborazine in the form of vapor has a temperature set at 150° C. to allow a film to be deposited with a dielectric constant of 2.21, a hardness of 4.3 GPa, and a Young's modulus of 35 GPa.

Furthermore the third insulation layer can be formed in a method similar to that employed for the second insulation layer except that N,N,N-trimethylborazine is used as a source material. The third insulation layer as obtained herein had a dielectric constant of 2.31, a hardness of 3.1 GPa, and a Young's modulus of 29 GPa. The second and third insulation layers had carbon contents, as obtained through XPS, of 32% and 25%, respectively. This shows that the present semiconductor device can provide enhanced contact and hardly has a layer peeling off another layer or a similar defect that impairs interconnection in reliability.

Note that while herein the cap layer is formed using SiC, the cap layer can also be formed using $SiO_2$, SiN, SiCN, SiOC, or the like.

In the present invention, these steps can be repeated, as required, to form multilayer interconnection. This can provide a structure employing an insulation material having a small dielectric constant for an interconnection structure. The structure employs an insulation film having large mechanical strength and also provides enhanced contact between an insulation layer and a cap layer. As such, if the structure experiences large stress in a CMP process, a wire bonding process and the like, the insulation layer is internally hardly destroyed or peels off another layer. A semiconductor device having an interconnection that is not impaired in reliability, can thus be provided.

Another specific example of the method of fabricating the semiconductor device shown in FIG. 1 will be described. Initially, on the first insulation layer 1 having a recess with the first conductor layer 2 buried therein, etching stopper layer 3 is formed, and thereon, as one example of a carbon-containing borazine compound, B,B,B—N,N,N-hexamethylborazine is used as a source material and CVD is employed to form the second insulation layer 4. Then the second insulation layer 4 has a surface processed with oxygen plasma to form the third insulation layer 7 on the second insulation layer 4. In the second and third insulation layers, a metal interconnection pattern is formed by photolithography and dry etching. Subsequently, copper is deposited to form the second conductor layer 5 and thereafter CMP is employed to form the conductor layer buried in the second and third insulation layers. Then a $SiO_2$ film is deposited as cap layer 8. The interconnection structure shown in FIG. 1 is thus provided.

The third insulation layer 7 can be formed by applying an RF of 13.56 MHz and between 50 W to 300 W to plasmatize nitrogen, oxygen, nitrogen monoxide or similar gas and use the plasmatized gas to process a surface of the second insulation layer 4. If oxygen is used for the plasma gas and 200 W is applied for one minute for the process, then the surface of the second insulation layer 4 decreases in carbon content from 32% to 11%. This shows that the present semiconductor device provides enhanced contact and hardly has a layer peeling off another layer and other defects that impair interconnection in reliability.

Second Embodiment

A semiconductor having a structure shown in FIG. 2 will be described. FIG. 2 is a schematic cross section of a semiconductor device in accordance with the present invention. The semiconductor device of FIG. 2 is identical to that of FIG. 1 except that the former has the second conductor layer 5 having a circumference surrounded by the third insulation layer 7.

More specifically, the semiconductor device having the structure shown in FIG. 2 includes a first insulation layer 1 having a recess with a first conductor layer 2 buried therein, an etching stopper layer 3 formed on the first insulation layer 1, a second insulation layer 4 formed on etching stopper layer 3, a second conductor layer 5 buried in a recess of the second insulation layer 4, and a third insulation layer 7 formed between the second conductor layer 5 and the second insulation layer 4.

Herein the second and third insulation layers 4 and 7 are grown by chemical vapor deposition with a carbon-containing borazine compound used as a source material and the third insulation layer 7 is smaller in carbon content than the second insulation layer 4.

A specific example of the method of fabricating the semiconductor device of FIG. 2 will be described hereinafter. Initially, on the first insulation layer 1 having a recess with the first conductor layer 2 buried therein, etching stopper layer 3 is formed, and thereon, as one example of a carbon-containing borazine compound, B,B,B—N,N,N-hexamethylborazine is used as a source material and CVD is employed to form the second insulation layer 4. In the second insulation layer 4, a metal interconnection pattern is formed by photolithography and dry etching. After the second insulation layer 4 is dry-etched and before a photoresist is removed, an inside of a recess formed by dry etching can be processed with oxygen plasma to provide the third insulation layer 7 between the second insulation layer 4 and the second conductor layer 5 buried in the second insulation layer 4.

Thereafter the second conductor layer 5 is formed. More specifically, copper is deposited and subsequently CMP is employed to form the second conductor layer 5 buried in the second and third insulation layers. Subsequently a $SiO_2$ film is deposited as a cap layer. The interconnection structure shown in FIG. 2 is thus provided.

Herein the third insulation layer can be formed in a method similar to that employed to form the third insulation layer indicated in the first embodiment. Herein, nitrogen was employed for plasma gas and 300 W was applied for one minute for the process, and it has been confirmed by XPS analysis that the surface of the second insulation layer 4 decreases in carbon content from 32% to 18%. This shows that the present semiconductor device provides enhanced contact and hardly has a layer peeling off another layer and other defects that impair interconnection in reliability.

These steps are repeated as required to form multilayer interconnection. This can provide a structure employing an insulation material having a small dielectric constant for an interconnection structure. The structure employs an insulation film having large mechanical strength and also provides enhanced contact between an insulation layer and a conductor layer. As such, copper is hardly diffused by heat, concentration of electric current. A semiconductor device having an interconnection that is not impaired in reliability, can thus be fabricated.

Third Embodiment

Figure 3:
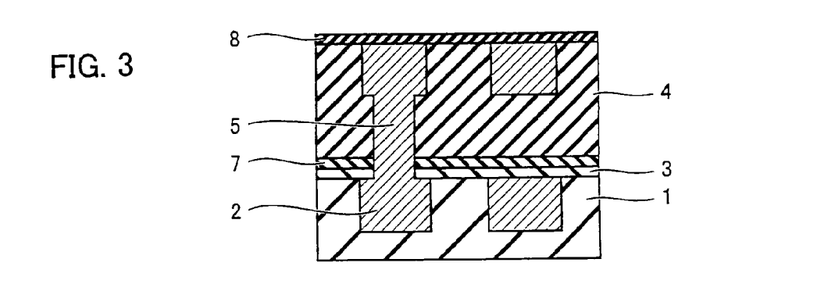

A semiconductor having a structure shown in FIG. 3 will be described. FIG. 3 is a schematic cross section of a semiconductor device in accordance with the present invention. The semiconductor device of FIG. 3 is identical to that of FIG. 1 except that the former has the second conductor layer 5 formed on etching stopper layer 3.

More specifically, the semiconductor device having the structure shown in FIG. 3 includes a first insulation layer 1 having a recess with a first conductor layer 2 buried therein, an etching stopper layer 3 formed on the first insulation layer 1, a second insulation layer 4 formed on etching stopper layer 3, a third insulation layer 7 formed between the second insulation layer 4 and etching stopper layer 3, and a second conductor layer 5 buried in a recess of the second and third insulation layers 4 and 7. Herein the second and third insulation layers 4 and 7 are grown by chemical vapor deposition with a carbon-containing borazine compound used as a source material and the third insulation layer 7 is smaller in carbon content than the second insulation layer 4.

A specific example of the method of fabricating the semiconductor device of FIG. 3 will be described hereinafter. Initially, on the first insulation layer 1 having a recess with the first conductor layer 2 buried therein, etching stopper layer 3 is formed, and thereon, as one example of a carbon-containing borazine compound, N,N,N-trimethylborazine is used as a source material and CVD is employed to form the third insulation layer 7. Then, as one example of the carbon-containing borazine compound, B,B,B—N,N,N-hexamethylborazine is used as a source material and CVD is employed to form the second insulation layer 4.

In these layers a metal interconnection pattern is formed by photolithography and dry etching. Thereafter, copper is deposited as the second conductor layer 5 and subsequently CMP is employed to form the second conductor layer 5 buried in the second and third insulation layers. Subsequently a SiC film is deposited as cap layer 8. The interconnection structure shown in FIG. 3 is thus provided.

This interconnection structure employs an insulation film having large mechanical strength and also provides enhanced contact between an insulation layer and a cap layer. As such, if the structure experiences large stress in a CMP process, a wire bonding process and the like, the insulation layer is internally hardly destroyed or peels off another layer. A semiconductor device having an interconnection that is not impaired in reliability can thus be provided.

Fourth Embodiment

Figure 4:
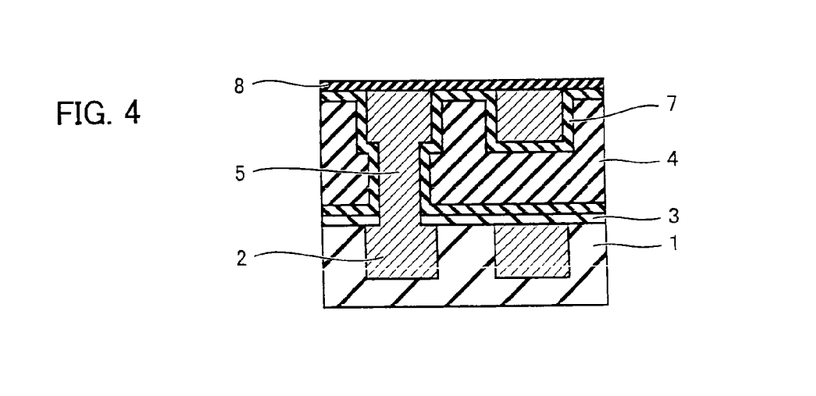

A semiconductor having a structure shown in FIG. 4 will be described. FIG. 4 is a schematic cross section of a semiconductor device in accordance with the present invention. The semiconductor device of FIG. 4 has the second conductor layer 5 having a structure corresponding to those of FIGS. 1-3 combined together.

More specifically, the semiconductor device having the structure shown in FIG. 4 includes a first insulation layer 1 having a recess with a first conductor layer 2 buried therein, an etching stopper layer 3 formed on the first insulation layer 1, a second insulation layer 4 formed on etching stopper layer 3, a second conductor layer 5 buried in a recess of the second insulation layer 4 and a third insulation layer 7, and the third insulation layer 7 formed on the second insulation layer 4 and between the second insulation layer 4 and etching stopper and the second conductor layers 3 and 5.

Herein the second and third insulation layers 4 and 7 are grown by chemical vapor deposition with a carbon-containing borazine compound used as a source material and the third insulation layer 7 is smaller in carbon content than the second insulation layer 4.

A specific example of the method of fabricating the semiconductor device of FIG. 4 will be described hereinafter. Initially, on the first insulation layer 1 having a recess with the first conductor layer 2 buried therein, etching stopper layer 3 is formed, and thereon, as one example of a carbon-containing borazine compound, N,N,N-trimethylborazine is used as a source material and CVD is employed to form the third insulation layer 7. Then, as one example of the carbon-containing borazine compound, B,B,B—N,N,N-hexamethylborazine is used as a source material and CVD is employed to form the second insulation layer 4. In these layers a metal interconnection pattern is formed by photolithography and dry etching. After the insulation layers are dry-etched and before a photoresist is removed, an inside of a recess formed by dry etching can be processed with oxygen plasma to provide the third insulation layer 7 between the second insulation layer 4 and the second conductor layer 5 buried in the second insulation layer 4.

Thereafter, copper is deposited to form the second conductor layer and subsequently CMP is employed to form the second conductor layer 5 buried in the second and third insulation layers. Subsequently a SiC film is deposited as cap layer 8. The interconnection structure shown in FIG. 4 is thus provided.

This interconnection structure employs an insulation film having large mechanical strength and also provides enhanced contact between an insulation layer and a cap layer. As such, if the structure experiences large stress in a CMP process, a wire bonding process and the like, the insulation layer is internally hardly destroyed or peels off another layer. A semiconductor device having an interconnection that is not impaired in reliability can thus be provided.

Fifth Embodiment

Figure 5:
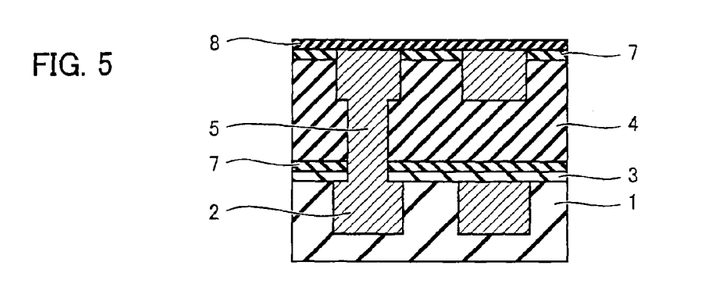

A semiconductor having a structure shown in FIG. 5 will be described. FIG. 5 is a schematic cross section of a semiconductor device in accordance with the present invention. The semiconductor device of FIG. 5 has the second conductor layer 5 having a structure corresponding to those of FIGS. 1 and 3 combined together.

More specifically, the semiconductor device having the structure shown in FIG. 5 includes a first insulation layer 1 having a recess with a first conductor layer 2 buried therein, an etching stopper layer 3 formed on the first insulation layer 1, a second insulation layer 4 formed on etching stopper layer 3, a third insulation layer 7 formed on the second insulation layer 4 and between the second insulation layer 4 and etching stopper layer 3, and a second conductor layer 5 buried in a recess of the second and third insulation layers 4 and 7.

Herein the second and third insulation layers 4 and 7 are grown by chemical vapor deposition with a carbon-containing borazine compound used as a source material and the third insulation layer 7 is smaller in carbon content than the second insulation layer 4.

A specific example of the method of fabricating the semiconductor device of FIG. 5 will be described hereinafter. Initially, on the first insulation layer 1 having a recess with the first conductor layer 2 buried therein, etching stopper layer 3 is formed, and thereon, as one example of a carbon-containing borazine compound, N,N,N-trimethylborazine is used as a source material and CVD is employed to form the third insulation layer 7.

Then, as one example of the carbon-containing borazine compound, B,B,B—N,N,N-hexamethylborazine is used as a source material and CVD is employed to form the second insulation layer 4. Furthermore thereon again as one example of the borazine compound N,N,N-trimethylborazine is used as a source material and CVD is employed to form the third insulation layer 7. In these layers a metal interconnection pattern is formed by photolithography and dry etching.

Thereafter, copper is deposited to form the second conductor layer and subsequently CMP is employed to form the conductor layer 5 buried in the second and third insulation layers. Subsequently a SiC film is deposited as cap layer 8. The interconnection structure shown in FIG. 5 is thus provided.

This interconnection structure employs an insulation film having large mechanical strength and also provides enhanced contact between an insulation layer and a cap layer. As such, if the structure experiences large stress in a CMP process, a wire bonding process and the like, the insulation layer is internally hardly destroyed or peels off another layer. A semiconductor device having an interconnection that is not impaired in reliability can thus be provided.

Sixth Embodiment

Figure 6:
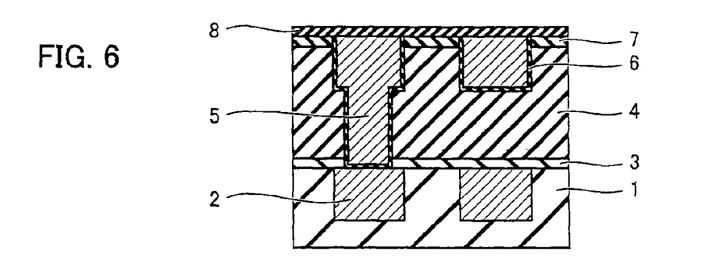

A semiconductor having a structure shown in FIG. 6 will be described. FIG. 6 is a schematic cross section of a semiconductor device in accordance with the present invention. The semiconductor device of FIG. 6 is identical to that of FIG. 1 except that the former has the second conductor layer 5 surrounded by a conductor diffusion preventing layer 6.

More specifically, the semiconductor device having the structure shown in FIG. 6 includes a first insulation layer 1 having a recess with a first conductor layer 2 buried therein, an etching stopper layer 3 formed on the first insulation layer 1, a second insulation layer 4 formed on etching stopper layer 3, a third insulation layer 7 formed on the second insulation layer 4, a second conductor layer 5 buried in a recess of the second and third insulation layers 4 and 7, and a conductor diffusion preventing layer 6 surrounding the second conductor layer 5.

A specific example of the method of fabricating the semiconductor device of FIG. 6 will be described hereinafter. Initially, on the first insulation layer 1 having a recess with the first conductor layer 2 buried therein, etching stopper layer 3 is formed, and thereon, as one example of a carbon-containing borazine compound, B,B,B—N,N,N-hexamethylborazine is used as a source material and CVD is employed to form the second insulation layer 4.

Then, as one example of the borazine compound, N,N,N-trimethylborazine is used as a source material and CVD is employed to form the third insulation layer 7. In these layers a metal interconnection pattern is formed by photolithography and dry etching. Subsequently, conductor diffusion preventing layer 6 is formed of Ta and thereafter copper is deposited to form the second conductor layer and then CMP is employed to form the second conductor layer 5 buried in the second and third insulation layers. Subsequently a SiC film is deposited as cap layer 8. The interconnection structure shown in FIG. 6 is thus provided.

While herein the conductor diffusion preventing layer is formed of Ta, the layer can also be formed for example of TaN, Ti, TiN, or the like. Note that the conductor diffusion preventing layer has a thickness for example of 5 nm.

Figure 7:
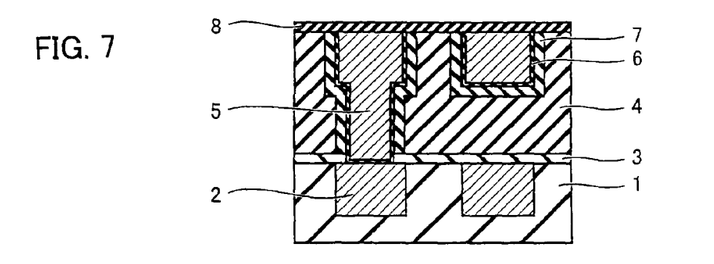
Figure 8:
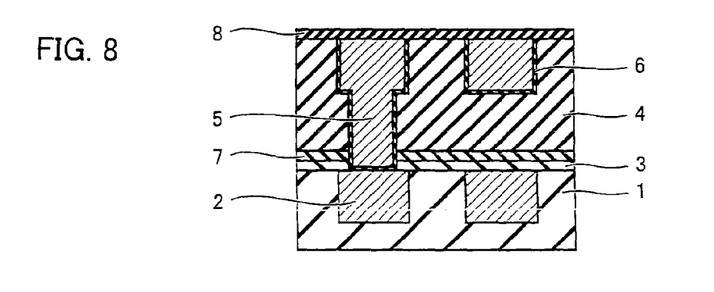
Figure 9:
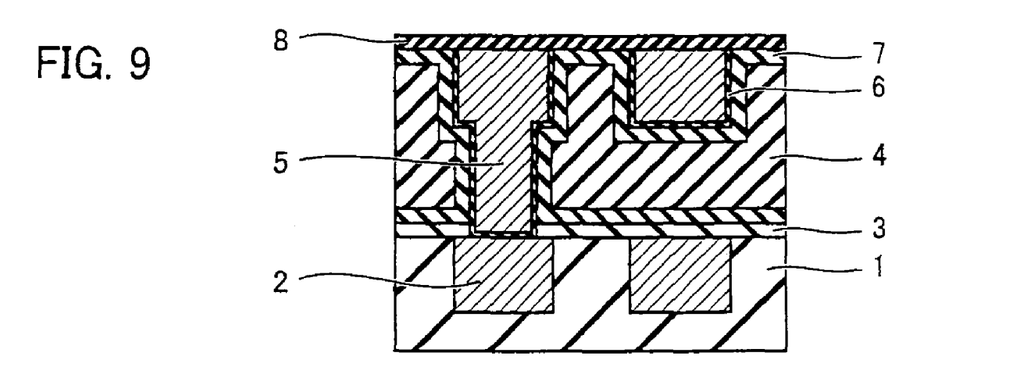
Figure 10:
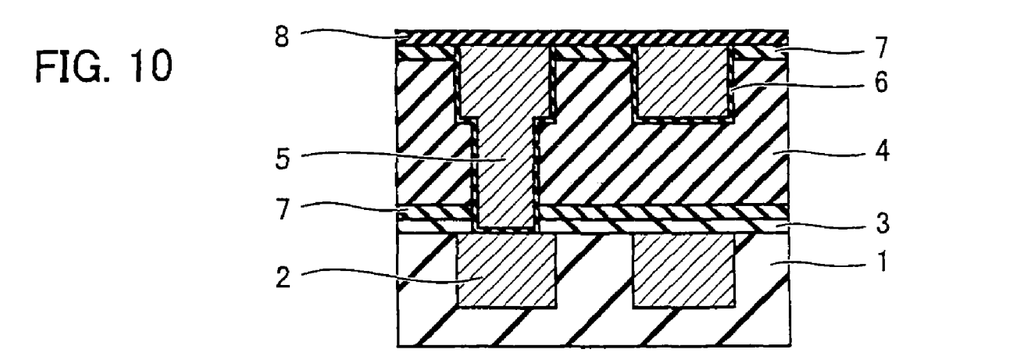

Furthermore, the methods described in the first to sixth embodiments plus the step of providing the conductor diffusion preventing layer before forming a conductor layer allow interconnection structures shown in FIGS. 7-10. More specifically, FIG. 7 shows a structure corresponding to that of the semiconductor device of FIG. 2 with the second conductor layer 5 having a circumference surrounded by conductor diffusion preventing layer 6. FIG. 8 shows a structure corresponding to that of the semiconductor device of FIG. 3 with the second conductor layer 5 having a circumference surrounded by conductor diffusion preventing layer 6. FIG. 9 shows a structure corresponding to that of the semiconductor device of FIG. 4 with the second conductor layer 5 having a circumference surrounded by conductor diffusion preventing layer 6. FIG. 10 shows a structure corresponding to that of the semiconductor device of FIG. 5 with the second conductor layer 5 having a circumference surrounded by conductor diffusion preventing layer 6.

This interconnection structure employs an insulation film having large mechanical strength and also provides enhanced contact between an insulation layer and a cap layer. As such, if the structure experiences large stress in a CMP process, a wire bonding process and the like, the insulation layer is internally hardly destroyed or peels off another layer. A semiconductor device having an interconnection that is not impaired in reliability can thus be provided.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A manufacturing method of a semiconductor device, the semiconductor device comprising:
   a first interlayer insulation film;
   a first copper wiring formed in the first interlayer insulation film;

a first insulation film formed on the first interlayer insulation film and the first copper wiring;
a second interlayer insulation film formed on the first insulation film, the second interlayer insulation film having a first via hole and a first trench, a bottom of the first via hole exposing an upper surface of the first copper wiring, a top of the first via hole connecting to a bottom of the first trench;
a second copper wiring formed in the first via hole and the first trench;
a second insulation film formed on the second copper wiring and the second interlayer insulation film; and
a third insulation film formed between the second interlayer insulation film and the second insulation film, the third insulation film connecting to the second interlayer insulation film, the third insulation film connecting to the second insulation film, the manufacturing method of the semiconductor device comprising:
forming the first interlayer insulation film, the first copper wiring;
forming the first insulation film;
forming the second interlayer insulation film by using CVD;
forming the third insulation film on the second interlayer insulation film by using CVD;
forming the second copper wiring; and
forming the second insulation film on the third insulation film and the second copper wiring,
wherein each of the second interlayer insulation film and the third insulation film comprises a borazine based compound, and
wherein the third insulation film layer is smaller in carbon content than the second interlayer insulation film.

2. The manufacturing method of the semiconductor device according to claim 1,
wherein the second interlayer insulation film consists of a first borazine based compound, and the third insulation film consists of a second borazine based compound.

3. A manufacturing method of a semiconductor device, the semiconductor device comprising:
a first interlayer insulation film;
a first copper wiring formed in the first interlayer insulation film;
a first insulation film formed on the first interlayer insulation film and the first copper wiring;
a second interlayer insulation film formed on the first insulation film, the second interlayer insulation film having a first via hole and a first trench, a bottom of the first via hole exposing an upper surface of the first copper wiring, a top of the first via hole connecting to a bottom of the first trench;
a second copper wiring formed in the first via hole and the first trench;
a second insulation film formed on the second copper wiring and the second interlayer insulation film; and
a third insulation film formed between the second interlayer insulation film and the second copper wiring, the third insulation film connecting to the second interlayer insulation film, the third insulation film connecting to the second copper wiring, the third insulation film formed on a side wall and a bottom surface of the first trench and a side wall of the first via hole,
the manufacturing method of the semiconductor device comprising:
forming the first interlayer insulation film, the first copper wiring;
forming the first insulation film;
forming the second interlayer insulation film by using CVD;
forming the third insulation film on the second interlayer insulation film so as to form the third insulation film on a surface of the first via hole the first trench by using CVD;
forming the second copper wiring; and
forming the second insulation film on the second copper wiring and the second interlayer insulation film,
wherein each of the second interlayer insulation film and the third insulation film comprises a borazine based compound, and
wherein the third insulation film layer is smaller in carbon content than the second interlayer insulation film.

4. The manufacturing method of the semiconductor device according to claim 3,
wherein the second interlayer insulation film consists of a first borazine based compound, and the third insulation film consists of a second borazine based compound.

5. A manufacturing method of a semiconductor device, the semiconductor device comprising:
a first interlayer insulation film;
a first copper wiring formed in the first interlayer insulation film;
a first insulation film formed on the first interlayer insulation film and the first copper wiring;
a second interlayer insulation film formed on the first insulation film, the second interlayer insulation film having a first via hole and a first trench, a bottom of the first via hole exposing an upper surface of the first copper wiring, a top of the first via hole connecting to a bottom of the first trench;
a second copper wiring formed in the first via hole and the first trench;
a second insulation film formed on the second copper wiring and the second interlayer insulation film; and
a third insulation film formed between the second interlayer insulation film and the first insulation film, the third insulation film connecting to the second interlayer insulation film, the third insulation film connecting to the first insulation film,
the manufacturing method of the semiconductor device comprising:
forming the first interlayer insulation film, the first copper wiring;
forming the first insulation film;
forming the third insulation film on the first insulation film by using CVD;
forming the second interlayer insulation film on the third insulation film by using CVD;
forming the second copper wiring; and
forming the second insulation film on the second copper wiring and the second interlayer insulation film,
wherein each of the second interlayer insulation film and the third insulation film comprises a borazine based compound, and
wherein the third insulation film is smaller in carbon content than the second interlayer insulation film.

6. The manufacturing method of the semiconductor device according to claim 5,
wherein the second interlayer insulation film consists of a first borazine based compound, and the third insulation film consists of a second borazine based compound.

* * * * *